(12) United States Patent
Gailhard et al.

(10) Patent No.: US 9,325,325 B2
(45) Date of Patent: Apr. 26, 2016

(54) METHOD AND DEVICE FOR MANAGING THE TIME TRANSITION OF A CMOS LOGIC CIRCUIT AS A FUNCTION OF TEMPERATURE

(71) Applicant: STMicroelectronics (Rousset) SAS, Rousset (FR)

(72) Inventors: Bruno Gailhard, Rognes (FR); Michel Cuenca, Septemes les Vallons (FR)

(73) Assignee: STMicroelectronics (Rousset) SAS, Roussett (FR)

( * ) Notice: Subject to any disclaimer, the term of this patent is extended or adjusted under 35 U.S.C. 154(b) by 0 days.

(21) Appl. No.: 14/502,095

(22) Filed: Sep. 30, 2014

(65) Prior Publication Data

US 2015/0097630 A1    Apr. 9, 2015

(30) Foreign Application Priority Data

Oct. 4, 2013  (FR) ..................................... 13 59631

(51) Int. Cl.
| | |
|---|---|
| H03L 1/02 | (2006.01) |
| H03K 19/0948 | (2006.01) |
| H03B 5/04 | (2006.01) |
| H03K 19/003 | (2006.01) |
| G05F 3/26 | (2006.01) |
| G11C 7/04 | (2006.01) |

(52) U.S. Cl.
CPC *H03L 1/026* (2013.01); *H03B 5/04* (2013.01); *H03K 19/00323* (2013.01); *H03K 19/00369* (2013.01); *H03K 19/0948* (2013.01); *G05F 3/262* (2013.01); *G11C 7/04* (2013.01)

(58) Field of Classification Search
CPC ... H03L 1/026; H03K 19/017; H03K 19/0948
USPC .............................. 331/17, 57, 185, 186, 176
See application file for complete search history.

(56) References Cited

U.S. PATENT DOCUMENTS

| | | | |
|---|---|---|---|
| 6,919,753 | B2 | 7/2005 | Wang et al. |
| 7,656,243 | B2 | 2/2010 | McCorquodale et al. |
| 8,115,559 | B2 | 2/2012 | Kim et al. |
| 8,134,414 | B2 | 3/2012 | McCorquodale et al. |
| 8,258,880 | B2 * | 9/2012 | Koh ....................... H03K 3/011 331/176 |
| 8,736,387 | B2 | 5/2014 | Mahooti et al. |
| 2004/0012449 | A1 | 1/2004 | Illegems |
| 2005/0030109 | A1 | 2/2005 | Kim |
| 2008/0061893 | A1 | 3/2008 | Lakshmikumar et al. |
| 2008/0079506 | A1 | 4/2008 | Chuah et al. |
| 2009/0295466 | A1 | 12/2009 | Truong et al. |
| 2010/0188156 | A1 | 7/2010 | Arai |
| 2011/0181367 | A1 | 7/2011 | Satoh et al. |
| 2011/0298556 | A1 | 12/2011 | Lin et al. |
| 2012/0139617 | A1 | 6/2012 | Gerna et al. |

* cited by examiner

Primary Examiner — Jeffrey Shin
(74) Attorney, Agent, or Firm — Slater Matsil, LLP

(57) ABSTRACT

A method includes generation of a first current proportional to absolute temperature and formation of a second current representative of the temperature variation of the threshold voltages of the transistors of the inverter and limited to a fraction of the first current. This fraction is less than one. The inverter is supplied with a supply current equal to the first current minus the limited second current.

23 Claims, 4 Drawing Sheets

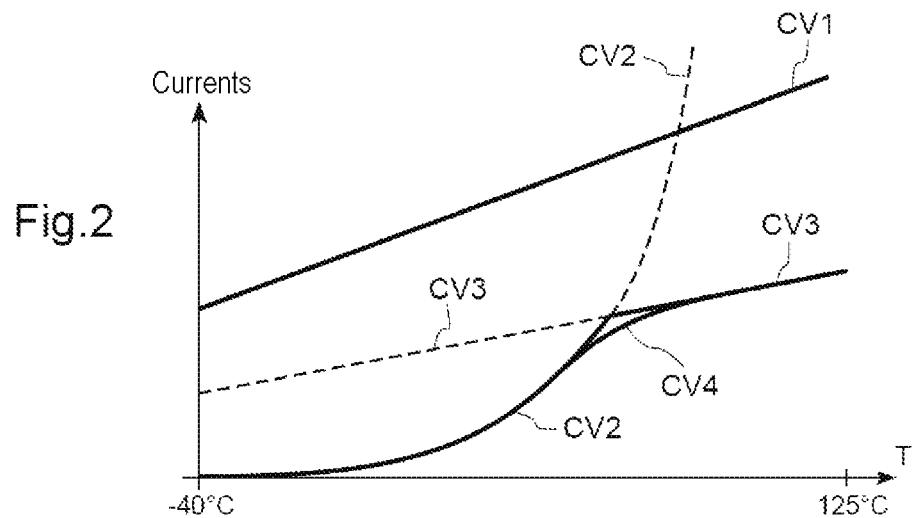
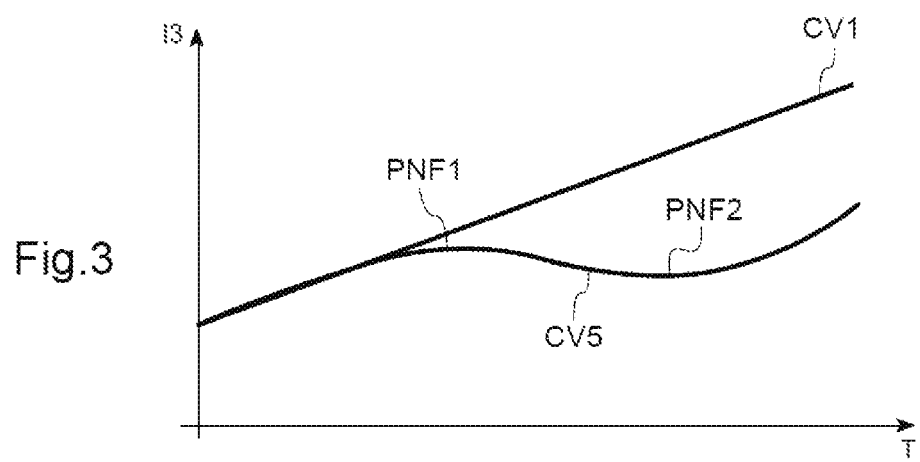
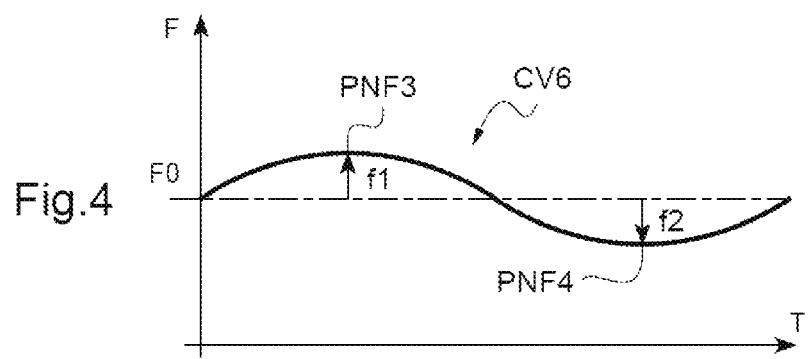

METHOD AND DEVICE FOR MANAGING THE TIME TRANSITION OF A CMOS LOGIC CIRCUIT AS A FUNCTION OF TEMPERATURE

This application claims the benefit of French Application No. 1359631, filed on Oct. 4, 2013, which application is hereby incorporated herein by reference.

TECHNICAL FIELD

The invention relates to microelectronics and, in particular embodiments, to method and device for managing the time transition of a CMOS logic circuit, e.g., an inverter, as a function of the temperature.

BACKGROUND

The propagation time of a logic circuit, for example, a logic gate or a CMOS inverter, is the time between the occurrence of a transition at the input of the logic circuit and the occurrence of the corresponding transition at the output of the logic circuit. This propagation time generally varies with temperature. This results in consequences for certain parameters of certain components, for example ring oscillators, using CMOS inverters as CMOS logic circuits.

A ring oscillator comprises an odd number of looped CMOS inverters.

Furthermore, the variation in the propagation time of the CMOS inverters as a function of temperature induces a variation in the frequency of the oscillator as a function of temperature.

In general, current sources which deliver a current proportional to absolute temperature (known to the person skilled in the art by the acronym PTAT) or a current inversely proportional to absolute temperature (known to the person skilled in the art by the acronym CTAT: Complementary to Absolute Temperature) are used in order to supply such components. However, it is not then possible to obtain temperature compensation with a single current source.

One known solution for carrying out temperature compensation of certain parameters, for example the frequency of an oscillator, consists in using a combination of a plurality of current sources, for example one source of the PTAT type and one source of the CTAT type, so as to obtain a supply current which is very insensitive to temperature variations. However, such solutions lead to devices which have significant bulk and consequent consumption.

SUMMARY

Embodiments of the invention relate to microelectronics, and more particularly to control of the variation in the propagation time of a CMOS logic circuit, for example a CMOS inverter, as a function of temperature. The invention applies advantageously, but not limitingly, to control of the frequency of an oscillator as a function of temperature.

According to one embodiment, it is proposed to control the propagation time of a CMOS logic circuit, for example an inverter, and more particularly the frequency of an oscillator, as a function of temperature by using only a single current source, and to do so with reduced bulk and low consumption.

According to one aspect, a method is provided for controlling the propagation time of a CMOS logic circuit, for example an inverter, as a function of temperature. A first current that is proportional to absolute temperature is generated. A second current is formed. The second current is representative of the temperature variation of the threshold voltages of the transistors of the inverter is and limited to a fraction of the first current. The fraction is less than one. The inverter is supplied with a supply current equal to the first current minus the second current.

Thus, the use of a single current source generating the first current and the formation of the second current, representative of the temperature variation of the threshold voltages of the transistors and limited to the fraction of the first current, makes it possible to obtain a supply current of the logic circuit whose change with temperature remains contained within a variation selected while taking the application into account. For this reason, the curve representing the change in the propagation time of the logic circuit as a function of temperature has two local extrema where the curve turns, thus making it possible to contain the variation in this propagation time within a desired range of values which may be very small.

According to one embodiment, the second current is substantially proportional to the sum of the threshold voltages of a reference NMOS transistor and a reference PMOS transistor, which are supplied with the second current.

In order to obtain good representativeness of the temperature variation of the threshold voltages of the transistors of the logic circuit, for example the inverter, over a full batch of transistors, it is preferable for the dimensional ratio between the reference transistors, that is to say the ratio between the quotient W/L of the reference PMOS transistor and the quotient W/L of the reference NMOS transistor, to be substantially equal to the dimensional ratio between the transistors of the logic circuit. (Here, W and L respectively denote the width and the length of the channel of the transistor).

According to another aspect, a method is provided for controlling the frequency of an oscillator as a function of temperature, the oscillator comprising a plurality of CMOS inverters, the method then comprising supply of each inverter with the supply current obtained by the control method defined above, in which each of the inverters of the oscillator forms a CMOS logic circuit.

According to another aspect, an electronic device is provided, comprising at least one CMOS logic circuit, for example a CMOS inverter, first circuitry configured in order to generate a first current proportional to absolute temperature, and second circuitry configured in order to form a second current representative of the temperature variation of the threshold voltages of the PMOS and NMOS transistors of the at least one logic circuit and limited to a fraction, which is less than one, of the first current, to subtract the second current from the first current so as to obtain a supply current, and to deliver the supply current to a first terminal of the at least one logic circuit.

According to one embodiment, the at least one CMOS logic circuit has a second terminal connected to a supply terminal of the device, which supply terminal is intended to receive a supply voltage, for example ground, and the second circuitry comprises an input terminal for receiving the first current and circuitry, which is connected between the input terminal and the supply terminal and comprises a reference PMOS transistor set up in diode mode and connected in series with a reference NMOS transistor set up in diode mode and with a current limiter configured in order to limit the current flowing in the circuitry to the fraction of the first current, the input terminal itself being connected to the first terminal of the at least one logic circuit.

According to one embodiment, the dimensional ratio between the reference transistors is substantially equal to the dimensional ratio between the PMOS and NMOS transistors of the at least one CMOS logic circuit.

The first circuitry may, for example, comprise a current source of the proportional to absolute temperature type.

According to one embodiment, the current source is configured in order to deliver a base current proportional to absolute temperature, and the first circuitry furthermore comprise a current mirror and a first current replicating module configured in order to deliver the first current, which is proportional to the base current, and the current limiter comprises the current mirror and an additional transistor connected in series with the two reference transistors, the additional transistor forming a second current replicating module with one of the transistors of the current mirror, the current limiter being configured in order to limit the current in the circuitry to the fraction of the first current.

By way of indication, the first current replicating module is configured in order to deliver the first current with a level equal to a first multiple (for example N) of the level of the base current, and the current limiter is configured in order to limit the current flowing in the circuit to a level equal to a second multiple (for example Q) of the level of the base current, the second multiple being less than the first multiple and taking into account the respective sizes of the transistors of the current mirror and the size of the additional transistor.

So as to be less sensitive to supply voltage variations, it is preferable for the first current replicating module to comprise two current replicating blocks in cascode.

According to one embodiment, the device comprises a plurality of CMOS inverters forming an oscillator, and the second circuitry is configured in order to deliver the supply current to the first terminal of each CMOS inverter.

According to another aspect, an integrated circuit comprising a device as defined above is provided.

BRIEF DESCRIPTION OF THE DRAWINGS

Other advantages and characteristics of the invention will become apparent on studying the detailed description of entirely nonlimiting embodiments and the appended drawings, in which:

FIGS. 1 to 7 illustrate various aspects of the invention.

DETAILED DESCRIPTION OF ILLUSTRATIVE EMBODIMENTS

Figure 1:
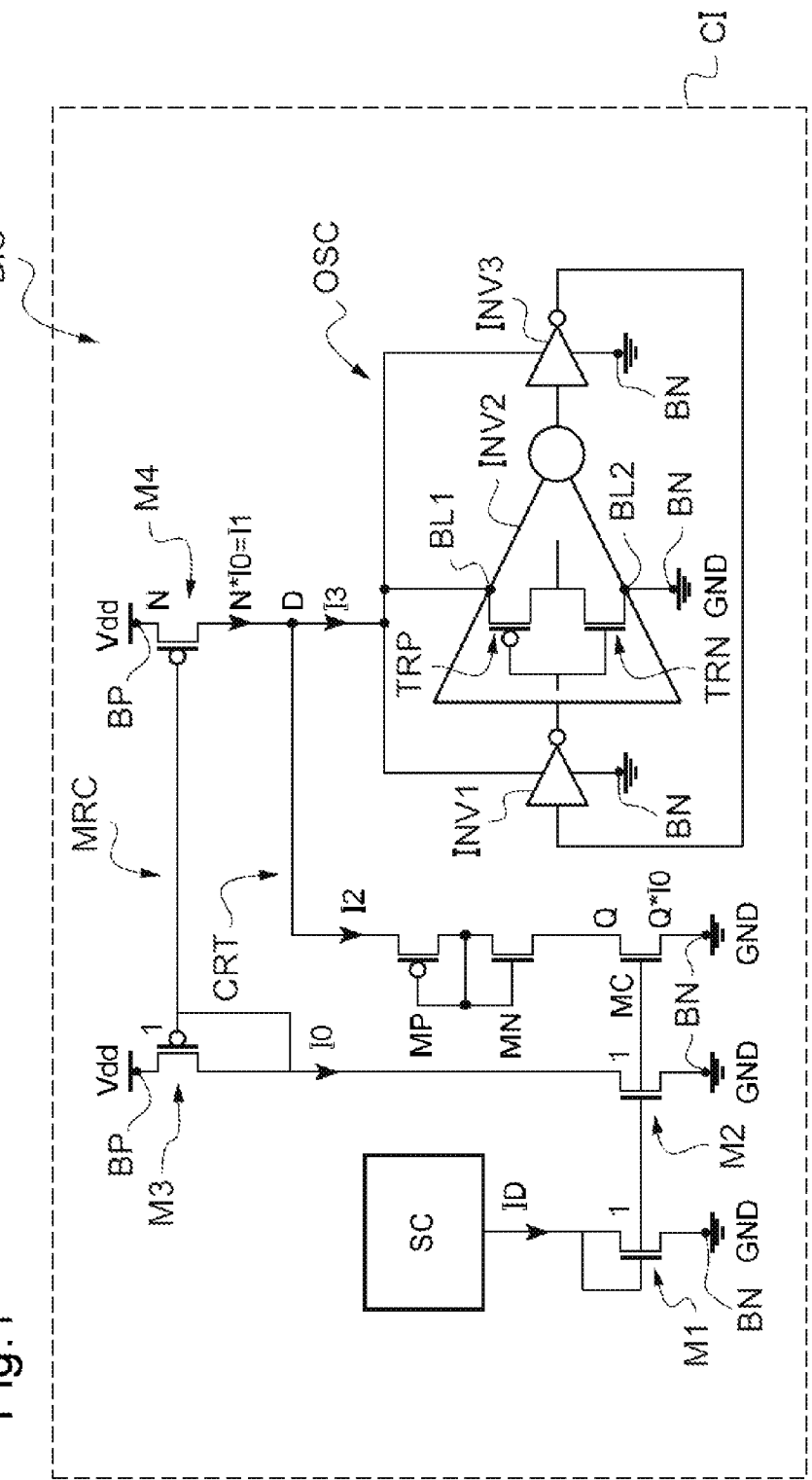

In FIG. 1, the reference DIS denotes an electronic device formed in an integrated fashion within an integrated circuit CI.

In the example described, the device DIS comprises a ring oscillator OSC which in this case comprises three looped inverters INV1-INV3.

The device DIS has a supply terminal BP intended to receive one supply voltage Vdd, and a supply terminal BN intended to be connected to another supply voltage, for example, ground GND.

Each inverter, for example the inverter INV2, comprises a PMOS transistor TRP and an NMOS transistor TRN, which are connected in series between a first terminal BL1 and a second terminal BL2 of the inverter. These terminals BL1 and BL2 are connected to the sources of the transistors TRP and TRN.

The second terminal BL2 is connected to the supply terminal BN (ground).

The device DIS comprises first circuitry for generating a first current I1 proportional to absolute temperature.

More precisely, in the example described here, the first circuitry comprises a current source SC of the PTAT type, generating a base current I0 proportional to absolute temperature.

In this example, the first circuitry also comprise a current mirror M1, M2 replicating the base current I0, and a first current replicating module MRC delivering, on the basis of the base current I0, the first current I1 whose strength is equal to N times the strength of the base current I0.

In this regard, the two PMOS transistors M1 and M2 in this example have a size ratio of 1 to 1, while the two PMOS transistors M3 and M4 of the first current replicating module MRC have a size ratio of 1 to N in this example.

The device DIS also comprises second circuitry comprising an input terminal, here the node D, and circuitry CRT connected between the input terminal D and the supply terminal BN (ground). The input terminal D is furthermore connected to the first terminal BL1 of each of the inverters INV1-INV3.

This circuitry CRT comprises a reference PMOS transistor MP set up in diode mode and connected in series with a reference NMOS transistor MN, also set up in diode mode, and with a current limiter configured in order to limit the current I2 flowing in the circuitry CRT to a fraction of the first current I1. Here, the current limiter comprises a first additional MOS transistor MC connected in series with the transistors MP and MN, as well as the two transistors M1, M2 of the current mirror. The gate of the transistor MC is connected to the gates of the transistors M1 and M2. The ratio of the sizes of the transistors MC and M2 is 1 to Q. The transistors M1 and MC form a second current replicating module. Of course, if the size ratio of the transistors M1 and M2 was b to 1, with b positive, this parameter b would be involved in the same way as Q in the value of the current limitation I2, the parameters b, Q and N then being selected in such a way that the limited current always corresponds to a fraction Q1/N, which is less than one, of the current I1.

Thus, the second circuitry is configured in order to form the second current I2 which is representative of the temperature variation of the threshold voltages of the transistors TRP and TRN of the inverters. This second current is limited to a fraction Q1/N of the first current I1. This fraction is less than one and here equal to Q/N (with Q<N) since the ratio of the sizes of the transistors M1 and M2 is 1 to 1. The second circuitry is also configured to subtract the second current I2 from the first current I1, so as to obtain a supply current I3 (equal to I1-I2) which is delivered to the first terminal BL1 of each of the inverters INV1-INV3 of the oscillator OSC.

In FIG. 2, curve CV1 represents the change in the current I1 for temperatures varying from −40° C. to +125° C. This current I1 is proportional to the temperature T since it is delivered from the current source SC which is a PTAT current source.

The voltage at the node D of the device DIS is to first order equal to the largest of the values of the threshold voltages of the transistors TRP and TRN of the inverters, increased here by a residual voltage value permitting oscillation of the oscillator OSC. Furthermore, so long as the voltage at this node D remains less than the sum of the threshold voltages of the reference transistors MP and MN, no current I2 can flow in the circuitry CRT. Conversely, when this voltage becomes greater than the sum of the threshold voltages of the transistors MP and MN, a current I2 starts to flow, this current being proportional to the sum of the threshold voltages of these reference transistors.

Furthermore, when the level of this current I2 tends to exceed Q times the base current I0 delivered by the source SC, the current I2 is limited to this value.

Curve CV2 illustrates with a solid line the change in the current I2 before it reaches its maximum level equal to Q times I0, while the dashed part of curve CV2 illustrates the change in the current I2 if it were not limited.

Curve CV3 illustrates the change (to first order, that is to say without taking the presence of the transistors MP and MN into account) in the current equal to Q times I0.

It can therefore be seen that, so long as the current I2 remains less than Q times I0, the change in the current I2 follows the solid part of curve CV2 then joins with the solid part of curve CV3 because of the current limitation by the limiter MC. The connecting part CV4 is due to the drain-source voltage difference of the transistor MC.

The reference transistors and the transistors of the inverters have advantageously been produced with the same technological process. The threshold voltages of the reference transistors MP and MN are consequently almost identical to the threshold voltages of the transistors TRP and TRN of the inverters.

Furthermore, so as to be less sensitive to possible manufacturing process variations over a full batch of products, the same dimensional ratio will preferably be selected for the reference transistors and for the transistors of the inverters. In other words, if W denotes the width of the channel of a transistor and L denotes its length, the person skilled in the art knows that there is a ratio K different from 1 between the quotient W/L relating to a PMOS transistor and the same quotient W/L relating to an NMOS transistor. Furthermore, the same ratio K will be selected for the transistors MP and MN.

When the temperature increases, the threshold voltage of an MOS transistor decreases. Thus, by way of nonlimiting example, if the threshold voltage of an MOS transistor, which is assumed to be identical for a PMOS transistor and for an NMOS transistor, is equal to 1 volt at −40° C., it may have the value 0.5 volt at 125° C. The voltage at the node D will decrease less rapidly with temperature than the sum of the threshold voltages of the reference transistors MP and MN.

Thus, if, by way of example, a residual voltage equal to 0.8 volt is selected, a voltage equal to 1.8 volts is obtained at the node D at −40° C., whereas the sum of the threshold voltages is equal to 2 volts. Furthermore, at −40° C., the current I2 is zero.

At 125° C., conversely, the voltage at the node D is equal to 1.3 volts whereas the sum of the threshold voltages is equal to 1 volt. Under these conditions, there is indeed a current I2 which flows at 125° C.

Furthermore, the size of the transistors MP and MN, that is to say their quotient W/L, will make it possible to adjust the strength of current I2 which is intended to be subtracted from the current I1 in order to obtain the current I3.

As illustrated in FIG. 3, subtraction of the limited current I2 from the current I1 makes it possible to obtain the change in the supply current I3 as represented by curve CV5.

Furthermore, it is noteworthy that this change, which is slightly proportional to absolute temperature, has two local extrema PNF1 and PNF2 at which curve CV5 turns. The first local extremum PNF1 is due to the subtraction of the unlimited current I2 whereas the second local extremum PNF2 is due to the subtraction of the limited current I2.

By adjusting the sizes of the transistors MP and MN, as well as the parameter Q, it is therefore possible to contain the change in the current I3 as a function of temperature within a certain range of current values.

Furthermore, as can be seen in FIG. 4, the change in the oscillation frequency of the oscillator OSC follows a curve CV6 which also has two local extrema PNF3 and PNF4 at which curve CV6 turns. It can therefore be seen that the change in the frequency as a function of temperature is contained within a certain range of frequencies around the rated frequency F0. Furthermore, the choice of the size of the reference transistors MP and MN, as well as the choice of the parameter Q, make it possible to adjust the values of the frequency differences f1 and f2.

Figure 5:
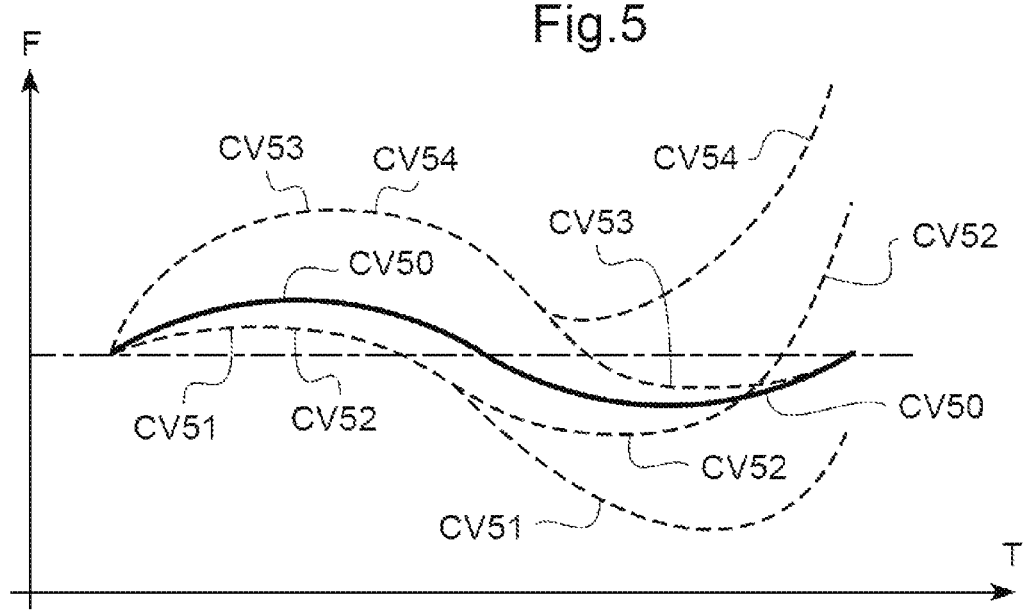

This is illustrated schematically in FIG. 5.

In this figure, curve CV50 illustrates an ideal sinusoidal change. Curves CV51 to CV54 illustrate changes in the frequency as a function of temperature as a result of the adjustment of different parameters, namely the width of the transistors MP and MN as well as the parameter Q.

Thus, if a large current is subtracted (large width of the reference transistors) and the current is limited little (high parameter Q), then the curve CV51 is obtained, that is to say there is a very small variation of the frequency at low temperature but a large peak variation at high temperature.

If a large current is subtracted (large width of the reference transistors) and the current is limited greatly (Q low), then the curve CV52 is obtained, that is to say there is a small change in the frequency as a function of temperature, a smaller peak change at medium temperatures, but conversely a large variation at high temperature.

If, conversely, little current is subtracted (smaller width of the transistors MP and MN) and the current is limited little (Q high), the change in the frequency follows the curve CV53, that is to say there is a large excursion at low temperature and a small excursion at high temperature.

If little current is subtracted and the current is limited greatly (Q low), then there is a large excursion at low temperature and a large excursion at high temperature (curve CV54).

The person skilled in the art will therefore know how to adjust the sizes of the reference transistors and the value of the parameter Q in order to obtain a change close to the curve CV50, so as to limit the frequency variation to a value ±x %, x being selected as a function of the application. Thus, in certain cases, it is possible to obtain a sinusoidal change in the frequency of the oscillator as a function of temperature, varying by from ±1% to ±2% around the rated frequency.

Selection of size of the transistors, as well as the parameter Q, is for example carried out by simulation.

Figure 6:
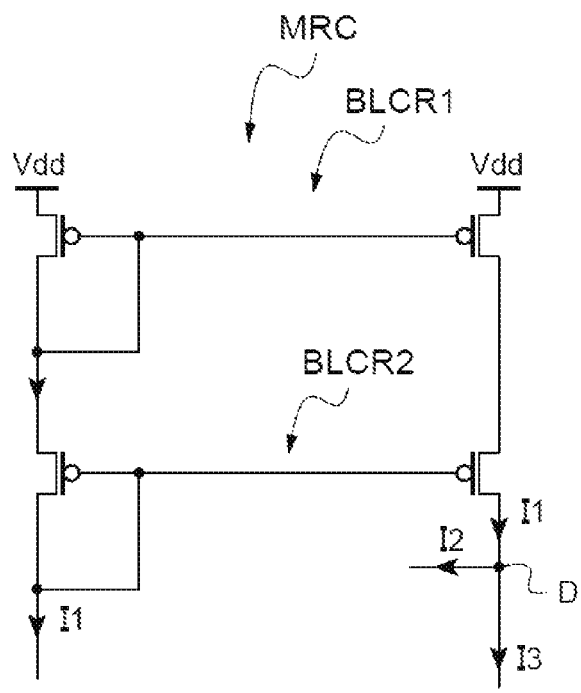

Whereas the first current replicating module MRC comprises only one current replicating block M3, M4 in the embodiment of FIG. 1, it is possible as illustrated in FIG. 6 to provide two current replicating blocks BLCR1, BLCR2 in cascode, delivering the current I1. This makes it possible to be less sensitive to the variations in the supply voltage Vdd. Of course, the embodiment of FIG. 6 is only one possible example of a cascode arrangement.

Whereas the embodiments which have just been described related to an oscillator OSC, it is possible to generalize the invention to control of the propagation time of a CMOS inverter as a function of temperature.

In fact, the circuits which have just been described may be used to control the change in the propagation time of an inverter, or of any other CMOS logic circuit comprising at least one PMOS transistor and at least one NMOS transistor, as a function of temperature, this variation also being sinusoidal. A NAND logic gate and a NOR logic gate are nonlimiting examples of CMOS logic circuits. In this regard, even with CMOS logic gates comprising a plurality of PMOS transistors and a plurality of NMOS transistors, it is sufficient to have, in the circuitry CRT, the two transistors MP and MN set up in diode mode which make it possible to obtain an "image" of the temperature variation of the threshold voltages of the PMOS and NMOS transistors of the logic gate. Even with CMOS logic gates comprising a plurality of PMOS transistors and a plurality of NMOS transistors, the voltage at the node D will decrease less rapidly with temperature than the sum of the threshold voltages of the reference transistors MP and MN.

Figure 7:
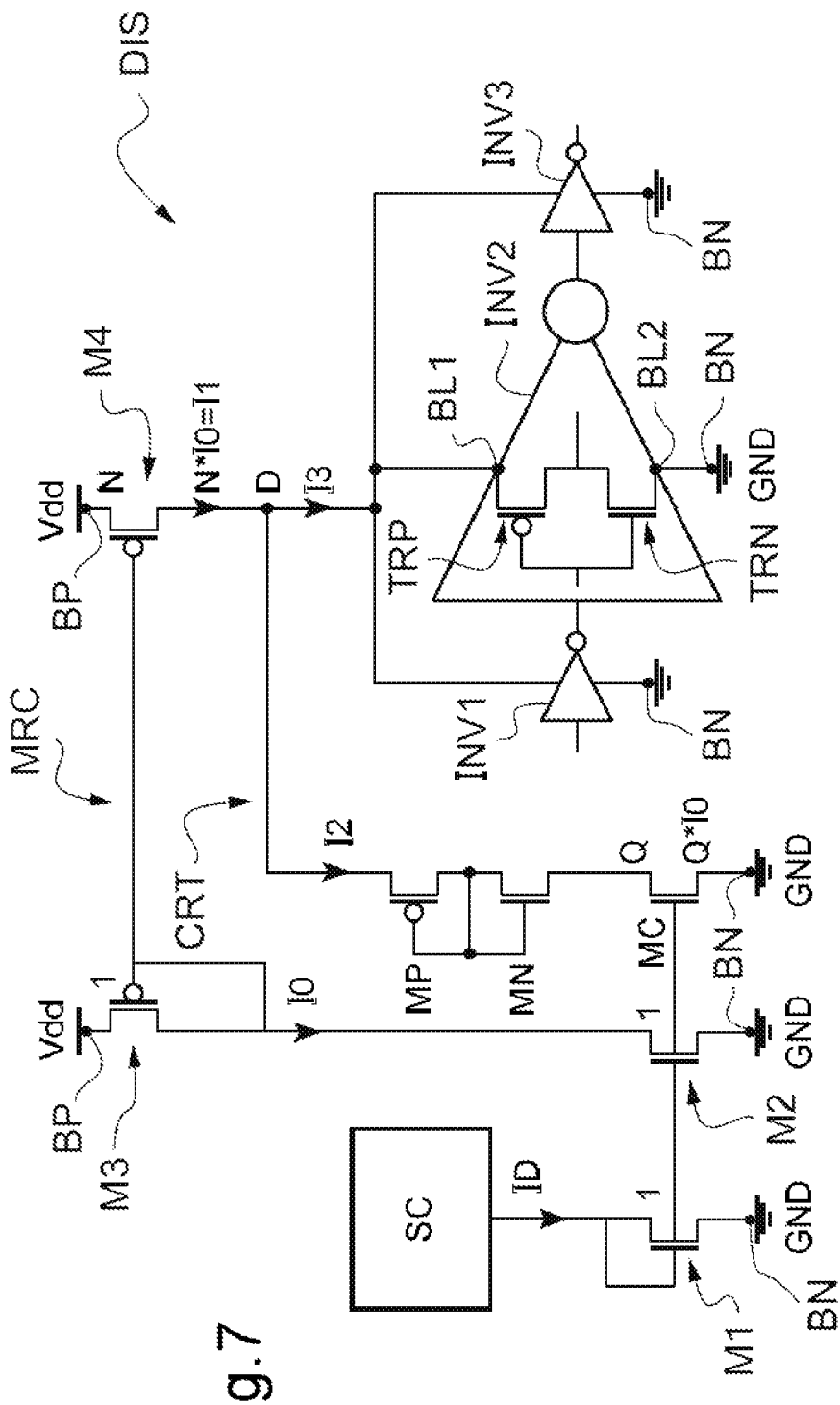

As illustrated in FIG. 7, the method may also for example be applied to a plurality of inverters in a chain, forming a delay line, which makes it possible to control the change in the value of the delays as a function of temperature.

Although the embodiments which have just been described relate in particular to generation of the current I1 by means of a PMOS transistor, a dual embodiment may of course be envisaged. More precisely, the current I1 may then be generated by means of an NMOS transistor and the limited current I2 may be generated by means of a PMOS transistor. The terminal BL1 is then connected to the supply voltage Vdd, whereas the terminal BN is connected to the node D, that is to say to the NMOS transistor delivering the current I1 and to the circuitry CRT.

What is claimed is:

1. A method for operating a CMOS logic circuit that comprises a PMOS transistor and an NMOS transistor, the method comprising:
    generating a first current proportional to absolute temperature;
    forming a second current representative of a temperature variation of threshold voltages of the PMOS and NMOS transistors of the logic circuit;
    using a current limiter to control the second current to be limited to a fraction of the first current, the fraction being less than one; and
    supplying the CMOS logic circuit with a supply current equal to the first current minus the second current.

2. The method according to claim 1, wherein the second current is substantially proportional to the sum of the threshold voltages of a reference NMOS transistor and a reference PMOS transistor that are supplied with the second current.

3. The method according to claim 2, wherein a dimensional ratio between the PMOS and NMOS reference transistors is substantially equal to a dimensional ratio between the PMOS and NMOS transistors of the logic circuit.

4. The method according to claim 1, wherein the logic circuit comprises a CMOS inverter.

5. The method according to claim 1, wherein the CMOS logic circuit comprises an oscillator, the method comprising controlling an operating frequency of the oscillator as a function of temperature.

6. An electronic circuit comprising:
    a CMOS logic circuit that comprises a PMOS transistor and an NMOS transistor;
    a PTAT-type current source configured to generated a current proportional to absolute temperature, where PTAT stands for proportional to absolute temperature;
    means for generating a first current that is proportional the current proportional to absolute temperature;
    means for forming a second current, the second current being representative of a temperature variation of threshold voltages of the PMOS and NMOS transistors of the logic circuit and limited to a fraction, which is less than one, of the first current;
    wherein the CMOS logic circuit is coupled to the means for generating the first current and the means for forming the second current so that a supply input of the CMOS logic circuit is configured to receive a supply current equal to the first current minus the second current.

7. An electronic device, comprising:
    a CMOS logic circuit that includes a PMOS transistor and an NMOS transistor;
    first circuitry configured to generate a first current proportional to absolute temperature; and
    second circuitry configured to:
        form a second current representative of a temperature variation of threshold voltages of the PMOS and NMOS transistors of the logic circuit,
        control the second current to be limited to a fraction, which is less than one, of the first current via a current limiter, and
        subtract the second current from the first current to obtain a supply current, and to deliver the supply current to a first terminal of the CMOS logic circuit.

8. The device according to claim 7, wherein the first circuitry comprises a current source of the proportional to absolute temperature type (PTAT).

9. The device according to claim 7, wherein the CMOS logic circuit has a second terminal connected to a supply terminal of the device, the supply terminal designed to receive a supply voltage, and wherein the second circuitry comprises an input terminal configured to receive the first current and a circuit connected between the input terminal and the supply terminal, the circuit comprising a reference PMOS transistor set up in diode mode and connected in series with a reference NMOS transistor set up in diode mode and with a current limiter configured to limit the current flowing in the circuitry to the fraction of the first current, the input terminal being connected to the first terminal of the CMOS logic circuit.

10. The device according to claim 9, wherein the CMOS logic circuit comprises a plurality of CMOS inverters that form an oscillator, wherein the second circuitry is configured to deliver the supply current to a first terminal of each CMOS inverter and wherein the input terminal is connected to the first terminal of each CMOS inverter.

11. The device according to claim 7, wherein the device comprises an integrated circuit.

12. An electronic device, comprising:
    a CMOS logic circuit that includes a PMOS transistor and an NMOS transistor;
    a current source of the proportional to absolute temperature type (PTAT), wherein the current source is configured in order to deliver a base current proportional to absolute temperature;
    a current mirror and a first current replicating module configured to deliver a first current, which is proportional to the base current;
    a current limiter that comprises the current mirror and an additional transistor connected in series with a PMOS reference transistors and an NMOS reference transistor, the additional transistor forming a second current replicating module with one of the transistors of the current mirror, the current limiter being configured to limit the current in the circuit to a fraction, which is less than one, of the first current; and
    second circuitry configured to generate a second current representative of a temperature variation of threshold voltages of the PMOS and NMOS transistors of the logic circuit and limited to a fraction, which is less than one, of the first current, to subtract the second current from the first current to obtain a supply current, and to deliver the supply current to a first terminal of the CMOS logic circuit.

13. The device according to claim 12, wherein a dimensional ratio between the PMOS and NMOS reference transistors is substantially equal to a dimensional ratio between the PMOS and NMOS transistors of the CMOS logic circuit.

14. The device according to claim 12, wherein the first current replicating module is configured to deliver the first current with a level equal to a first multiple of the level of the base current, and the current limiter is configured to limit the current flowing in the circuit to a level equal to a second multiple of the level of the base current, the second multiple being less than the first multiple and taking into account the respective sizes of the transistors of the current mirror and the size of the additional transistor.

15. The device according to claim 12, wherein the first current replicating module comprises two current replicating blocks in cascode.

16. The device according to claim 12, wherein the logic circuit comprises a CMOS inverter.

17. The device according to claim 16, wherein the CMOS logic circuit comprises a plurality of CMOS inverters.

18. The device according to claim 17, wherein the plurality of CMOS inverters form an oscillator, wherein the second circuitry is configured to deliver the supply current to a first terminal of each CMOS inverter.

19. A method for operating a CMOS logic circuit, the method comprising:
   generating a first current proportional to absolute temperature;
   mirroring the first current to generate a second current that is a multiple of the first current;
   mirroring the first current to generate a third current that is based on threshold voltages of a reference PMOS transistor and a reference NMOS transistor, the third current having a magnitude that is less than a magnitude of the second current; and
   supplying the CMOS logic circuit with a supply current with a magnitude that is equal to the magnitude of the second current less the magnitude of the third current.

20. The method according to claim 19, wherein the third current is substantially proportional to the sum of the threshold voltages of the reference NMOS transistor and the reference PMOS transistor, wherein a dimensional ratio between the PMOS and NMOS reference transistors is substantially equal to a dimensional ratio between a PMOS transistor and an NMOS transistor of the logic circuit.

21. The method according to claim 19, wherein the CMOS logic circuit comprises an oscillator, the method comprising controlling an operating frequency of the oscillator as a function of temperature.

22. The method according to claim 21, wherein the second current is substantially proportional to the sum of the threshold voltages of a reference NMOS transistor and a reference PMOS transistor that are supplied with the second current.

23. The method according to claim 22, wherein a dimensional ratio between the PMOS and NMOS reference transistors is substantially equal to a dimensional ratio between the PMOS and NMOS transistors of the oscillator.

* * * * *